(12) United States Patent
Wilson

(10) Patent No.: US 9,377,796 B2
(45) Date of Patent: Jun. 28, 2016

(54) INTERFERENCE SUPPRESSION FOR SWITCHED MODE POWER SUPPLY

(71) Applicant: SnapTrack, Inc., San Diego, CA (US)

(72) Inventor: Martin Paul Wilson, Cambourne (GB)

(73) Assignee: QUALCOMM Incorporated, San Diego, CA (US)

(*) Notice: Subject to any disclaimer, the term of this patent is extended or adjusted under 35 U.S.C. 154(b) by 205 days.

(21) Appl. No.: 13/937,577

(22) Filed: Jul. 9, 2013

(65) Prior Publication Data
US 2014/0022012 A1   Jan. 23, 2014

(30) Foreign Application Priority Data

Jul. 10, 2012   (GB) ................................ 1212215.6

(51) Int. Cl.
| | | |
|---|---|---|
| *H02M 3/18* | (2006.01) | |
| *G05F 1/46* | (2006.01) | |
| *G05F 1/59* | (2006.01) | |
| *H02M 1/12* | (2006.01) | |
| *H02M 3/158* | (2006.01) | |
| *H03F 1/02* | (2006.01) | |
| *H03F 3/189* | (2006.01) | |
| *H03F 3/24* | (2006.01) | |

(52) U.S. Cl.
CPC ........... *G05F 1/468* (2013.01); *G05F 1/59* (2013.01); *H02M 1/126* (2013.01); *H02M 3/1584* (2013.01); *H03F 1/0227* (2013.01); *H03F 3/189* (2013.01); *H03F 3/24* (2013.01); *H03F 2200/102* (2013.01); *H03F 2200/511* (2013.01)

(58) Field of Classification Search
CPC .......... H02M 1/34; H02M 2001/4291; H02M 2001/322; H02M 3/33507; H02M 3/33592; H02M 33/33515; H02M 1/26; H02M 3/1584; H02M 1/0227; H02M 3/189; H02M 3/24; Y02B 70/1475; G05F 1/468; G05F 1/59
USPC ........................................ 363/131, 56.12, 59
See application file for complete search history.

(56) References Cited

U.S. PATENT DOCUMENTS

| | | | | |
|---|---|---|---|---|
| 6,184,666 | B1 * | 2/2001 | Boeckmann | H02M 3/1584 323/271 |
| 6,703,897 | B2 * | 3/2004 | O'Flaherty | H03F 1/0244 330/107 |
| 2003/0058041 | A1 * | 3/2003 | Koizumi | H03F 3/189 330/51 |
| 2005/0254271 | A1 | 11/2005 | Negoi | |
| 2005/0287976 | A1 * | 12/2005 | Burgener | H03F 1/223 455/333 |
| 2006/0281431 | A1 * | 12/2006 | Isaac et al. | 455/323 |

(Continued)

FOREIGN PATENT DOCUMENTS

GB   2480614 A   11/2011

OTHER PUBLICATIONS

Rowland Hunt, "International Patent Application No. GB1212215. 6_Search Report", Nov. 16, 2012.

*Primary Examiner* — Jessica Han
*Assistant Examiner* — Lorena Bruner
(74) *Attorney, Agent, or Firm* — Patterson & Sheridan, LLP

(57) ABSTRACT

The invention relates to a switched mode power supply comprising at least one switch and at least one inductor, the at least one switch being arranged to connect one terminal of the at least one inductor to one of a plurality of supply voltages, the other terminal of the at least one inductor providing a supply output, and further comprising a capacitor connected in parallel with the at least one inductor.

18 Claims, 6 Drawing Sheets

(56) References Cited

U.S. PATENT DOCUMENTS

| | | | | |
|---|---|---|---|---|
| 2007/0222033 A1* | 9/2007 | Ariie | ............ | H03F 3/189 257/580 |
| 2008/0238538 A1* | 10/2008 | Chiu | ............ | H03F 3/189 327/594 |
| 2009/0267582 A1* | 10/2009 | Prodic et al. | ............ | 323/283 |
| 2011/0006764 A1* | 1/2011 | Pearce | ............ | G01R 33/123 324/258 |
| 2011/0148200 A1* | 6/2011 | Burns | ............ | H02M 1/32 307/43 |
| 2011/0211380 A1 | 9/2011 | Brown | | |
| 2011/0292697 A1* | 12/2011 | Alexander | ............ | 363/37 |

\* cited by examiner

INTERFERENCE SUPPRESSION FOR SWITCHED MODE POWER SUPPLY

CROSS-REFERENCE TO RELATED APPLICATION(S)

British patent application GB 1212215.6, filed on Jul. 10, 2012, is incorporated herein by reference.

BACKGROUND TO THE INVENTION

1. Field of the Invention

The present invention relates to the reduction of signals of unwanted frequencies in switched mode power supplies, and particularly but not exclusively to switched mode power supplies for envelope tracking applications such as may be used for radio frequency (RF) amplifiers.

2. Description of the Related Art

Frequency domain duplex (FDD) systems include transceivers that have a transmitter and a receiver which operate at different carrier frequencies. A simple exemplary architecture of such an FDD system is illustrated in FIG. 1. A transceiver includes a transmitter block 6 which receives an input signal on line 2 to be transmitted by an antenna 18. A receiver block 8 receives signals that are detected at the antenna 18 and delivers them on signal line 4. The output of the transmitter 6 is delivered to a duplex filter 14 on line 10. The received signal from the antenna 18 is delivered from the duplex filter 14 on a line 12 to the receiver 8. The antenna 18 is connected to the duplex filter 14 via a line 16.

In such an FDD system it is important that energy from the transmitter does not block the receiver. This blocking may occur because the duplex filter on the output of the transmitter has only limited attenuation. Any noise present at the receiver frequency on the transmitter output, due to noise from the transmitter, has the potential to cause receiver blocking.

It is an aim of the invention to provide an improved technique for reducing the noise generated by a switched mode power supply.

SUMMARY OF THE INVENTION

In accordance with the invention there is provided a switched mode power supply which comprises at least one switch and at least one inductor. The at least one switch is arranged to connect one terminal of the at least one inductor to one of a plurality of supply voltages. The other terminal of the at least one inductor provides a supply output. There is further provided a capacitor connected in parallel with the at least one inductor.

The switch is preferably differed between discrete power supplies to generate a switched power supply at the one terminal of the inductor. Connecting the capacitor in parallel with the inductor allows for frequency suppression or attenuation at a selected frequency determined by the capacitor value.

A damping resistor is preferably provided in series with the capacitor. The value of the damping resistor is chosen in order to damp the attenuation of the current in the supply output above the suppression frequency of the capacitor.

There may be provided a plurality of switches and an associated plurality of inductors. Each of the plurality of switches is then preferably arranged to connect one terminal of each of the associated inductors to one of a plurality of supply voltages. The other terminals of each of the inductors are commonly connected to provide the supply output. In accordance with the invention there may further be provided a plurality of associated capacitors, each capacitor being connected in parallel with a respective inductor. A plurality of associated damping resistors may further be provided in series with each of the plurality of capacitors. The plurality of capacitors may each have the same capacitance value. The plurality of capacitors are preferably selectively connected in parallel simultaneously with the respective inductors, each capacitor being connected in series with a switch. The switch may have a resistance value which comprises the damping resistor.

Each parallel capacitor for each inductor may comprise a bank of parallel capacitors, each capacitor in the bank being arranged to be selectively connected in parallel across the respective inductor. The bank of parallel capacitors may have capacitance values that are binary weighted. Thus where there is a single inductor and switch arrangement a plurality of parallel capacitors may be provided for the inductor, each being associated with the switch such that they can be selectively connected in parallel with the inductor. Where a plurality of inductors are provided, and a corresponding plurality of switches, each of the plurality of inductors may be provided with a plurality of parallel capacitors. The bank of parallel capacitors for each inductor, where a plurality of inductors are provided, consist of a set of capacitors for each inductor having a corresponding set of values, such that when one capacitor is selected for one inductor, a capacitor of the same value is selected for each of the other inductors.

In general the capacitors may be selected such that either no capacitor is connected in parallel with an inductor, or one capacitor is connected in parallel, or more than one capacitor is connected in parallel at any one time.

Where a plurality of inductors and associated plurality of switches is provided, and a plurality of parallel capacitors is provided for each individual inductor, there may be provided a bank of parallel switches for all banks of capacitors, i.e. a common bank of switches for the sets of capacitors. Thus one switch is provided for each available capacitor value, rather than one switch being provided for each actual capacitor.

An error amplifier may be provided for comparing a signal level at the supply output with an input reference signal, and for removing any error therebetween.

The switched mode power supply may be provided as part of an envelope tracked power supply.

The switched mode power supply may be provided as part of an envelope tracked power supply for an RF amplification stage, in which the reference signal is representative of the envelope of the input signal to be amplified.

BRIEF DESCRIPTION OF THE FIGURES

The invention is now described with reference to the following figures, in which.

DESCRIPTION OF THE PREFERRED EMBODIMENT

In the following description the invention is described with reference to exemplary embodiments and implementations. The invention is not limited to the specific details of any arrangements as set out, which are provided for the purposes of understanding the invention.

In particular the invention is described in the context of an implementation of a switched mode power supply in an envelope tracking power supply for an RF power amplifier. The invention however is not limited to an envelope tracking power supply or an RF power implementation.

Figure 1:
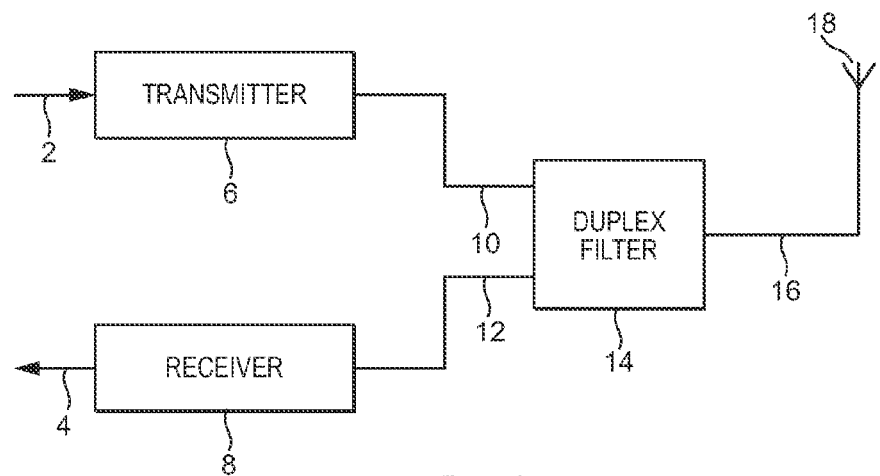
FIG. 1 illustrates the front-end of an exemplary FDD transceiver.
Figure 2:
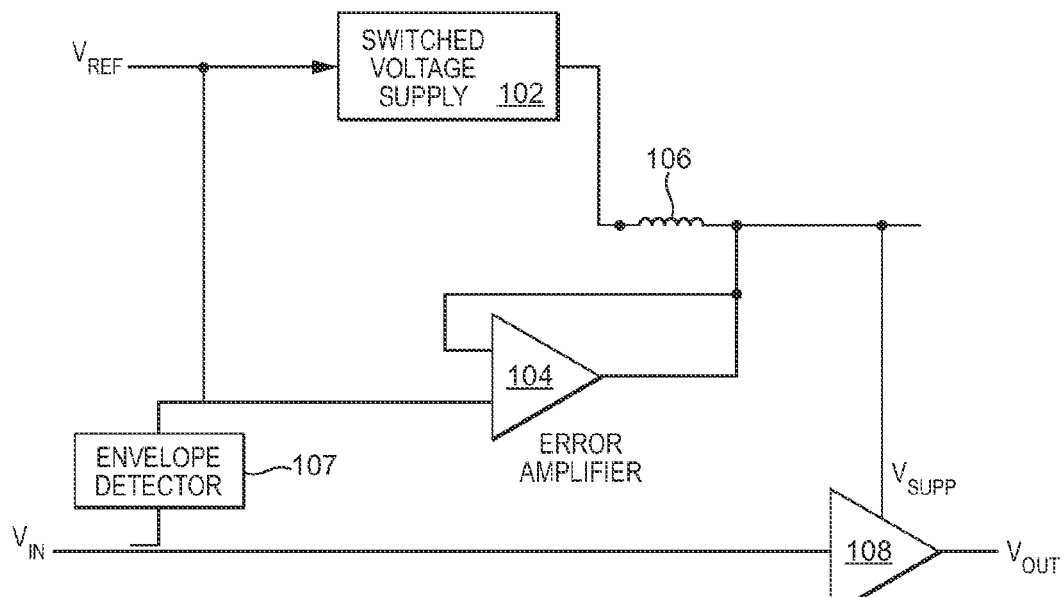
FIG. 2 illustrates an exemplary envelope tracking power supply.

FIG. 2 illustrates the architecture of an exemplary amplification stage including an envelope tracking power supply which may be implemented in an FDD transmitter. The purpose of the amplification stage is to develop an amplified version of an input voltage $V_{IN}$ as an output voltage $V_{OUT}$. A reference voltage $V_{REF}$ represents the amplitude of the input signal $V_{IN}$ and is used to generate a supply voltage $V_{SUPP}$ for delivery to a load, comprising an RF power amplifier 108. The output signal $V_{OUT}$ is intended to be an amplified replica of the input voltage $V_{IN}$.

An envelope detector 107 receives the input voltage $V_{IN}$ and generates the reference voltage $V_{REF}$ representing the envelope of the input signal. A switched mode power supply 102 receives the reference signal $V_{REF}$, and generates an output supply from one of multiple available supply voltages, in dependence on which most closely matches the instantaneous value of the reference signal $V_{REF}$. The selected supply voltage is applied to a first terminal of an inductor 106, and an output supply current is generated at the second terminal of the inductor.

The switched mode power supply 102 is an efficient supply, but only coarsely tracks the reference signal $V_{REF}$ at its input. To provide a more accurate tracked signal, an error amplifier 104 is provided to remove an error in the selected supply. In the simple illustrated architecture, the error amplifier receives the reference signal $V_{REF}$ at one input, and the output of the error amplifier 104 at the other input. The output of the error amplifier 104 is also connected to the second terminal of the inductor 106. The error amplifier 104 is a voltage to current converting amplifier, and injects a current at the second terminal of the inductor 106 which represents the error between the signal at the second terminal of the inductor 106 and the reference signal.

The thus adjusted (or corrected) output current at the second terminal of the inductor 106 is delivered to the power supply terminal of the RF power amplifier 108, and the voltage signal $V_{OUT}$ is developed at the output of the amplifier 108.

It will be appreciated that FIG. 2 represents an exemplary architecture to illustrate the principle of an envelope tracking switched mode power supply for an RF amplifier, and additional circuitry may be required for an actual implementation.

The switches of the switched mode power supply 102 enable the delivery of most of the envelope power of the voltage supply signal by efficient means through the inductor 106. The error amplifier 104 provides fine control at the output of the switched mode power supply, and enables removal of the unwanted injected signals through the inductor 106.

An envelope tracking system such as illustrated in FIG. 2 generates unwanted noise by using a switched mode power supply for efficiency, and this can generate noise over a broad spectrum. The output noise specification of a given system may be breached if this noise appears on the output power supply.

It is known in the prior art to provide a buck modulator in the switched mode voltage supply 102 in combination with an inductor, such as inductor 106, which filters off unwanted high frequency products. This is reasonably effective, but may not be enough to achieve the required high suppression of transmit noise in the receive band. If it is not enough, then it is necessary to either increase the inductor value or decrease the switcher rate. Both of these options have penalties in terms of reduced efficiency and/or increased error amplifier demand.

Figure 3:
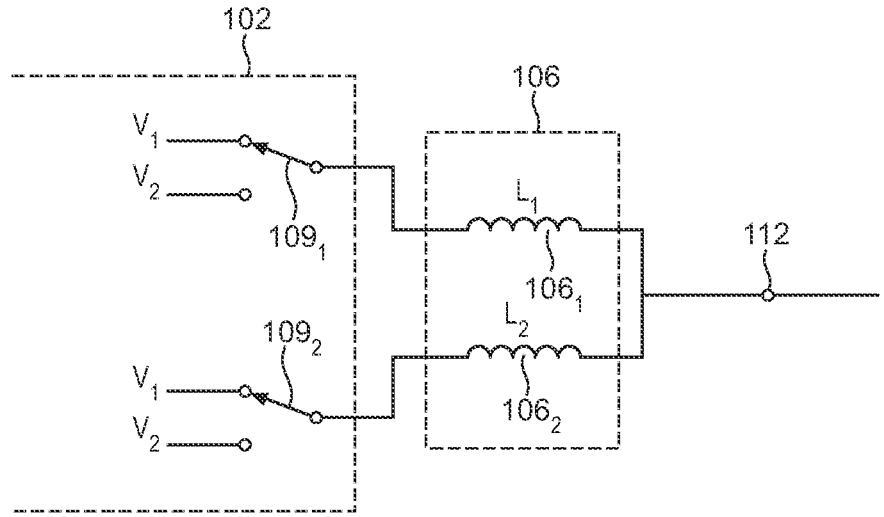
FIG. 3 illustrates an exemplary implementation of a switched mode power supply of the envelope tracking power supply of FIG. 2.

FIG. 3 illustrates a typical arrangement of the buck switching part of the switched mode voltage supply 102 of the envelope tracking system of FIG. 2 in more detail, together with the inductor 106. In the exemplary arrangement of FIG. 3 there is provided a pair of switches $109_1$ and $109_2$, each of which is arranged to connect one of (i) a voltage $V_1$; or (ii) a voltage $V_2$ to first terminals of respective inductors $106_1$ and $106_2$. The inductors $106_1$ and $106_2$ in combination provide the inductor 106 of FIG. 2. It will be appreciated that the control circuitry which controls the switches $109_1$ and $109_2$ in dependence on $V_{REF}$ is not shown.

The switches $109_1$ and $109_2$ are dithered between the discrete voltage levels to give a desired output current as known in the art. The current from each switch is combined by the common connection of the second terminals of each inductor $106_1$ and $106_2$ at node 112. The current is an approximation of the required current at the output of the modulator.

Figure 4:
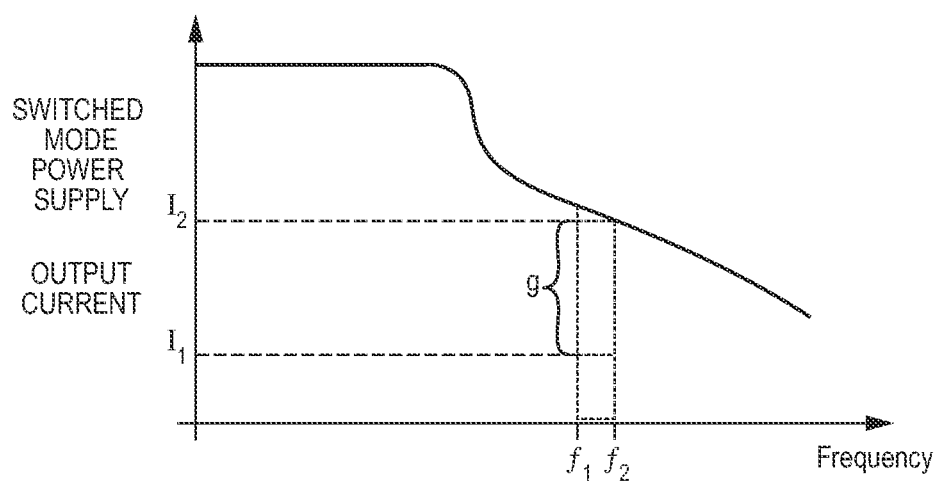
FIG. 4 illustrates a plot of current against frequency for the exemplary implementation of a switched mode power supply of FIG. 3.

Because of the nature of the rapid switching of the switches $109_1$ and $109_2$, the spectrum of the signal generated at node 112 has significant high frequency energy as illustrated in FIG. 4, which shows a plot of the current at node 112 against frequency.

In an FDD system, if this current as shown in FIG. 4 is fed directly into the supply terminal of the RF power amplifier 108, the transmitter output would possibly block the receiver band.

As illustrated in FIG. 4 there is a gap, g, between the actual noise output current level $I_2$ and the mandatory receive band noise maximum current $I_1$ in FIG. 4, between the frequencies $f_1$ and $f_2$ which represent the receive frequency band. This gap, g, is equal to the ratio of power amplifier output impedance to the error amplifier output impedance. In the system illustrated in FIG. 3, an extremely low output impedance means that the error amplifier feedback loop is required to have a very large bandwidth.

Figure 5:
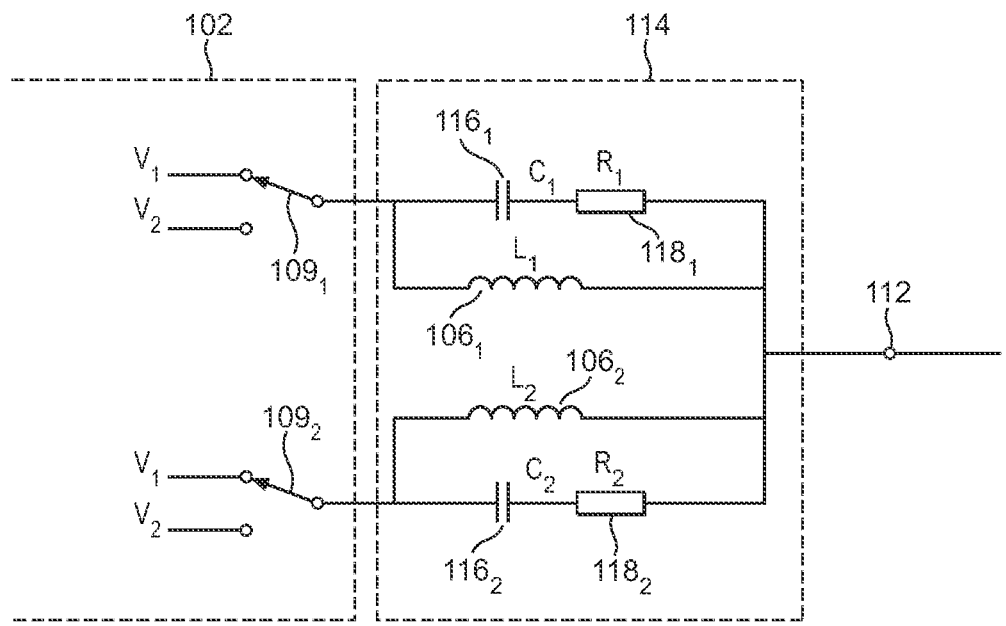
FIG. 5 illustrates an exemplary implementation of a switched mode power supply of the envelope tracking power supply of FIG. 2 in accordance with an embodiment of the invention.

With reference to FIG. 5, there is illustrated a modification to the exemplary arrangement of FIG. 3 in accordance with the invention.

As illustrated in FIG. 5, capacitor-resistor networks are added in parallel with each inductor winding. These capacitor resistor networks place a zero in the response of the buck transfer function of the inductors.

More particularly, with reference to FIG. 5, the exemplary switches $109_1$ and $109_2$ of the switched mode power supply 102 as illustrated in FIG. 3 are again illustrated. The inductors $106_1$ and $106_2$ are again connected to a respective switch $109_1$ and $109_2$ at first terminals, and have their second terminals combined at node 112.

In addition, in accordance with the described embodiment, a capacitor $116_1$ and a series resistor $118_1$ are connected in parallel with the inductor $106_1$; and a capacitor $116_2$ and a series resistor $118_2$ are connected in parallel with the inductor $106_2$. Each capacitor is illustrated as having one terminal connected to the respective switch, and the other terminal connected to a terminal of its series resistor. The other terminal of each resistor is connected to node 112. The inductor arrangement 116 of FIG. 3 is thus replaced by an inductor and parallel capacitor-resistor arrangement 114 in FIG. 5.

The purpose of each capacitor is to attenuate the current noise in a certain frequency range. The value of the capacitor determines at what frequency or frequency range current attenuation/suppression occurs. The purpose of the resistor is to dampen the current at frequencies above the desired frequency suppression range. Without the damping resistor, the capacitor may cause the current at node 112 to shoot up at frequencies above the frequency range where attenuation is desired. The requirement for the damping resistor is not essential: in certain implementations the increase in current at high frequencies may not be problematic or undesirable.

Figure 6:
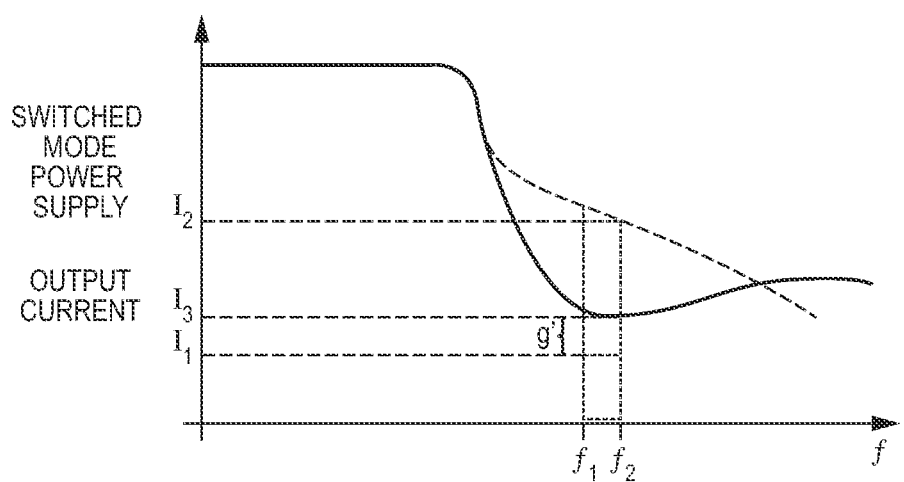
FIG. 6 illustrates a plot of current against frequency for the exemplary implementation of a switched mode power supply of FIG. 5.

The effect of the adaptation as shown in FIG. 5 is to change the current spectrum at node 112 as shown in FIG. 6.

It can be seen that the gap, g', between the mandatory receive band noise maximum current $I_1$ and the actual noise output current $I_3$ in the receive band between $f_1$ and $f_2$ is now much smaller. This reduction in the gap means that the required ratio of error amplifier output impedance to power amplifier output impedance is now much closer, and consequently the error amplifier performance requirements are not as severe as in the arrangement of FIG. 3. In dependence on the implementation, $I_3$ may be equal to or less than $I_1$.

Although in the foregoing mention is made of suppression in a frequency band, in practice the capacitor value is chosen to achieve suppression at a specific frequency, which results in suppression in a range either side of that frequency. The capacitor value may therefore be chosen to suppress at a frequency which is in the middle of the receive band.

It can also be seen in FIG. 6 that at higher frequencies above $f_2$ the current may rise up above the original current of FIG. 4 (which is shown as a dashed line) even with the damping resistor present. However if these higher frequencies are not in the receive band of the receiver then this is of no consequence.

The arrangement of FIG. 5 in which two switches and two inductors are illustrated is exemplary. There may be provided one switch and one inductor, and more than two switches/inductors. There is, however, a one-to-one ratio between switches and inductors. Each inductor is provided with a parallel capacitor, and preferably a damping resistor in series with that capacitor.

The capacitor for each inductor is chosen to have the same value, such that $C_1=C_2$. Similarly the damping resistors are chosen to have the same value, such that $R_1=R_2$.

Figure 7:
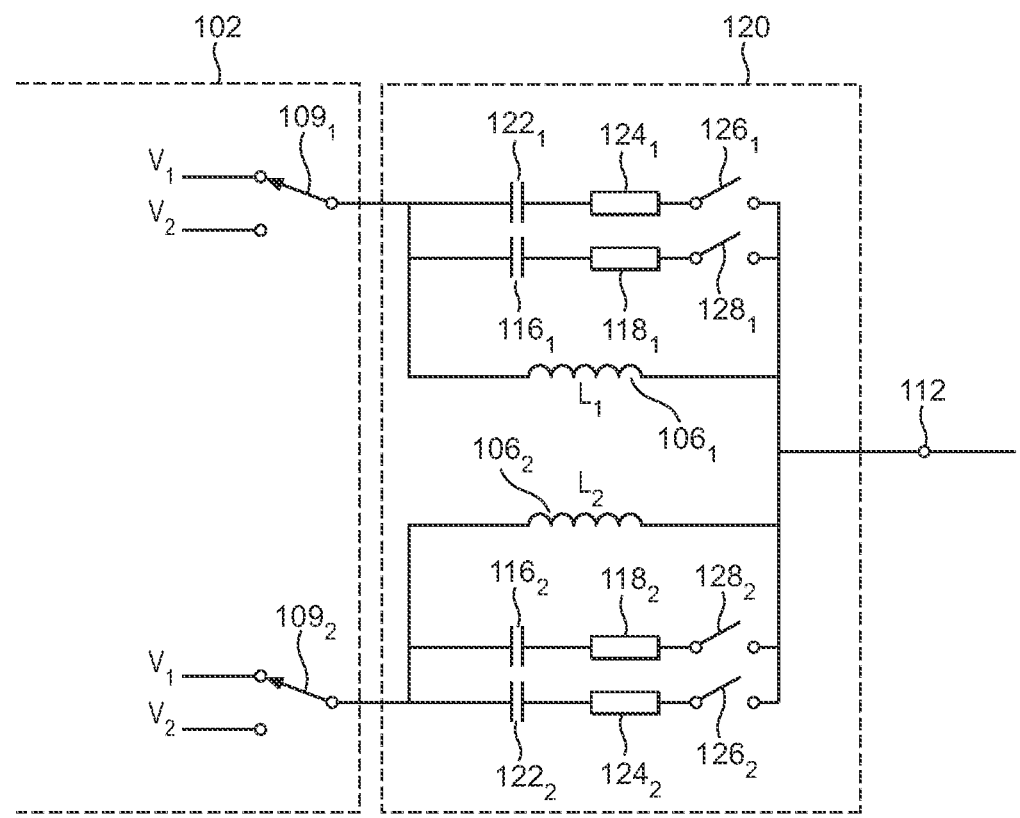
FIG. 7 illustrates an exemplary implementation of a switched mode power supply of the envelope tracking power supply of FIG. 2 in accordance with an embodiment of the invention.

An alternative exemplary implementation to that of FIG. 5 is illustrated in FIG. 7.

In a practical implementation, it may be necessary to cater for a number of frequency bands with different receive offsets, i.e. the receive frequency may vary, such that the interference frequencies from the transmit signal which must be suppressed may vary.

In the arrangement of FIG. 7, the inductor $106_1$ is provided with a second parallel capacitor $122_1$ and associated optional series damping resistor $124_1$. A switch $126_1$ connects the resistor $124_1$ to node $112_1$ and a switch $128_1$ connects the resistor $118_1$ to node 112. The capacitors $116_1$ and $122_1$ have different values, such that they have a suppression effect at different frequencies. The switches $126_1$ and $128_1$ are preferably controlled to allow one or both of the capacitors $116_1$ or $122_1$ to be connected according to the desired frequency of interference to be suppressed.

Similarly, the inductor $106_2$ is provided with a second parallel capacitor $122_2$ and associated optional series damping resistor $124_2$. A switch $126_2$ connects the resistor $124_2$ to node 112, and a switch $128_2$ connects the resistor $118_2$ to node 112. The capacitors $116_2$ and $122_2$ have different values, such that they have a suppression effect at different frequencies. The switches $126_1$ and $128_2$ are controlled to allow one or both of the capacitors $116_2$ or $122_2$ to be connected according to the desired frequency of interference to be suppressed.

The arrangement 114 of FIG. 5 is thus replaced by the arrangement 120 of FIG. 7.

The switches $126_1$ and $126_2$ will be simultaneously open or simultaneously closed. The switches $128_1$ and $128_2$ will be simultaneously open or simultaneously closed. The control of such switches will be implementation dependent, but they may be set in the factory or in the field. The values of capacitors $122_1$ and $122_2$ are equal, and the values of resistors $126_1$ and $126_2$ are equal.

The arrangement of FIG. 7 thus allows the interference suppression to be selected to perform at more than one frequency, and it will be apparent how this mechanism may be extended to even more frequencies by the addition of further parallel switched capacitors. It should be noted that in the arrangement of FIG. 7 it is also possible to select no parallel capacitance and thus not apply suppression.

Whilst the arrangement of FIG. 7 illustrates two parallel capacitors for each inductor, in general each inductor may be provided with a bank of parallel capacitors (of different values) and associated switches. The bank of parallel capacitors and associated switches may be binary weighted.

Figure 8:
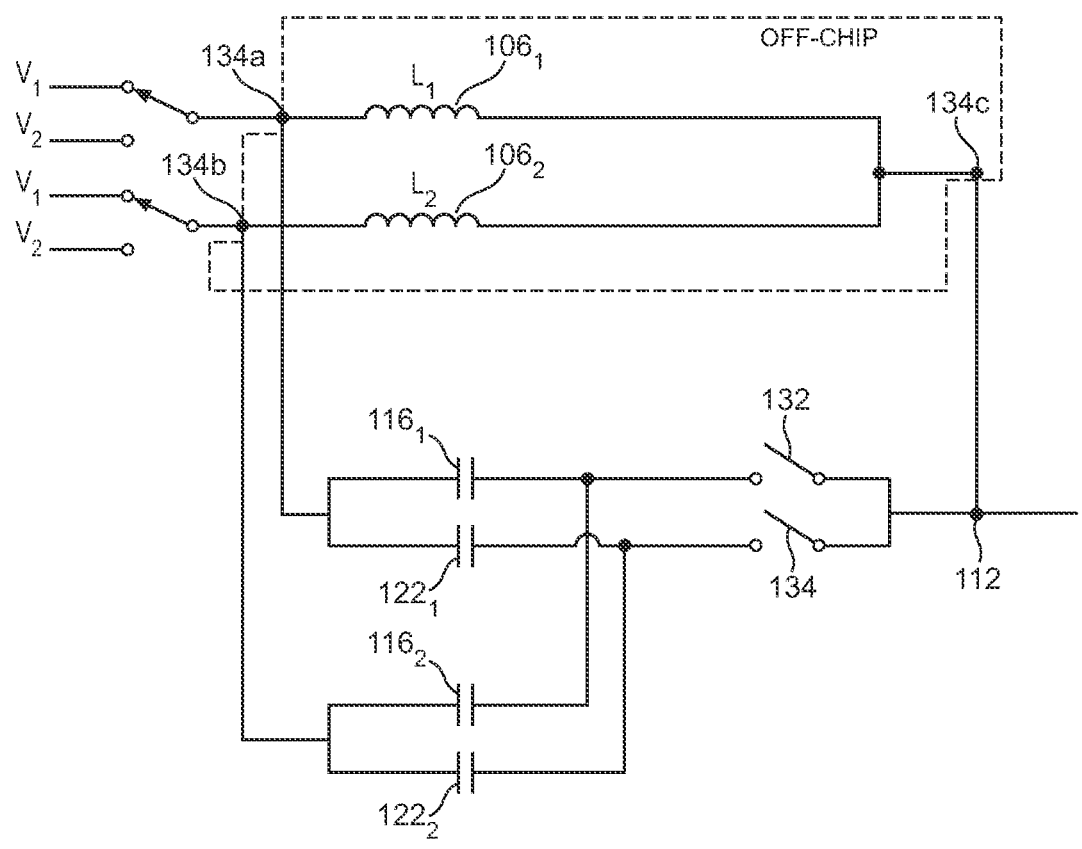
FIG. 8 illustrates an exemplary implementation of a switched mode power supply of the envelope tracking power supply of FIG. 2 in accordance with an embodiment of the invention.

The arrangement of FIG. 7 introduces additional switches. In an actual implementation, one skilled in the art will appreciate that the number of switches may be minimised. FIG. 8 illustrates a further example in which efficiencies are made including the number of switches being reduced.

In FIG. 8, a common switch 132 selectively connects the capacitor $116_1$ and $116_2$ to the node 112 and a common switch 134 selectively connects the capacitors $122_1$ and $122_2$ to the node 112.

In FIG. 8, the damping resistors associated with the capacitors are not shown, as the damping resistance values are incorporated within the switch fabrication.

The capacitors are of such a value that they can preferably be incorporated into the chip, rather than being provided external to the chip. The nodes 134a, 134b, 134c represent connectors off-chip to the off-chip inductors. All other elements are provided on-chip with the power amplifier (not shown in FIG. 8).

The chip interface is preferably arranged as shown in FIG. 8 to allow minimal degradation due to interconnect parasitics.

Figure 9:
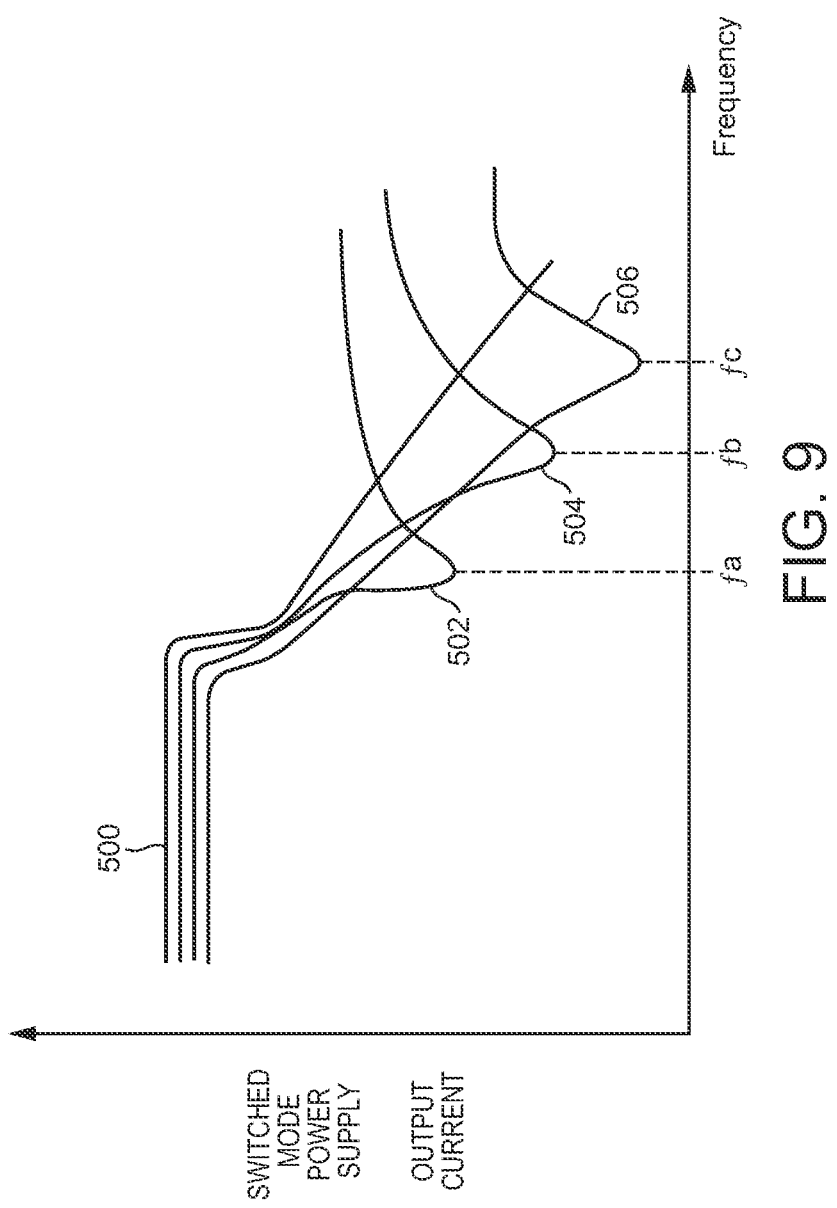
FIG. 9 illustrates a plot of current against frequency for the exemplary implementation of a switched mode power supply of FIG. 8.

FIG. 9 illustrates a plot of the output current spectrum for an exemplary arrangement as shown in FIG. 8 (or FIG. 7).

The lowest frequency notch (closest to the receive band offset) is achieved at a frequency $f_a$ by having the switches 132 and 134 closed together. This is associated with the plot 502 in FIG. 9. This gives the lowest high frequency rejection.

By switching only the largest of the capacitors in, the notch corresponds to plot 504 with suppression at frequency $f_b$ in FIG. 9. The high frequency attenuation is greater.

By switching only the smallest capacitor in, the notch corresponds to plot 506 with suppression at frequency $f_c$ in FIG. 9. This corresponds to the greatest receive offset.

By opening all switches, the plot 500 corresponding to the original plot of FIG. 4 is obtained. This may be suitable for large receive frequency offsets.

The invention may generally be implemented as part of a switched mode power supply, an envelope tracking power supply, or an RF amplification stage incorporating an envelope tracking power supply.

Such implementations have particular utility in mobile communication systems, particularly mobile or portable handset devices, but also in mobile communication infrastructure.

The invention has been described herein by way of example with reference to embodiments. The invention is not limited to the described embodiments, nor to specific combination of features in embodiments. Modifications may be made to the embodiments within the scope of the invention. The scope of the invention is defined by the appended claims.

What is claimed is:

1. A switched mode power supply comprising:
a first switch;
a first inductor connected with the first switch, wherein the first switch is arranged to:
    connect a first terminal of the first inductor with a first voltage when the first switch is in a first switching state; and
    connect the first terminal of the first inductor with a second voltage when the first switch is in a second switching state;
a first capacitor connected in parallel with the first inductor between the first terminal and a second terminal of the first inductor;
a second switch;
a second inductor connected with the second switch, wherein the second switch is arranged to:
    connect a first terminal of the second inductor with the first voltage when the second switch is in a third switching state; and
    connect the first terminal of the second inductor with the second voltage when the second switch is in a fourth switching state, wherein the second terminal of the first inductor and a second terminal of the second inductor are configured to provide a supply output; and
a second capacitor connected in parallel with the second inductor between the first and second terminals of the second inductor.

2. The switched mode power supply of claim 1, wherein capacitance values of the first and second capacitors are selected based on a desired frequency of suppression at the supply output.

3. The switched mode power supply of claim 1, further comprising a first damping resistor and a second damping resistor, wherein:
a first series connection is formed by the first damping resistor connected in series with the first capacitor, wherein the first series connection is connected in parallel between the first and second terminal of the first inductor; and
a second series connection is formed by the second damping resistor connected in series with the second capacitor, wherein the second series connection is connected in parallel between the first and second terminals of the second inductor.

4. The switched mode power supply of claim 1, wherein the first and second capacitors each have the same capacitance value.

5. The switched mode power supply of claim 1, further comprising:
a third capacitor, wherein the first and third capacitors are selectively connected in parallel with the first inductors;
a third switch connected in series with the third capacitor;
a fourth switch connected in series with the first capacitor;
a fourth capacitor, wherein the second and fourth capacitors are selectively connected in parallel with the second inductor;
a fifth switch connected in series with the fourth capacitor; and
a sixth switch connected in series with the second capacitor.

6. The switched mode power supply of claim 5, further comprising a first damping resistor, a second damping resistor, a third damping resistor, and a fourth damping resistor,
wherein the damping resistance of the first damping resistor is incorporated within the fourth switch;
wherein the damping resistance of the third damping resistor is incorporated within the third switch,
wherein the damping resistance of the fourth damping resistor is incorporated within the fifth switch, and
wherein the damping resistance of the second damping resistor is incorporated within the sixth switch.

7. The switched mode power supply of claim 1, wherein the first capacitor further comprises a bank of parallel capacitors connected in parallel between the first and second terminals of the first inductor, and the second capacitor further comprising another bank of parallel capacitors connected in parallel between the first and second terminals of the second inductor.

8. The switched mode power supply of claim 7, wherein the bank of parallel capacitors and the other bank of parallel capacitors have capacitance values that are binary weighted.

9. The switched mode power supply of claim 8, wherein the first capacitor is selected from the bank of capacitors such that either no capacitors, one capacitor, or more than one capacitor is selected at any time, and wherein the second capacitor is selected from the other bank of capacitors such that either no capacitors, one capacitor, or more than one capacitor is selected at any time.

10. The switched mode power supply of claim 7, wherein each bank of capacitors has a set of capacitors of different values, each bank having a set of corresponding values.

11. The switched mode power supply of claim 7, further comprising a bank of parallel switches for each bank of capacitors, for selectively connecting the bank of capacitors.

12. The switched mode power supply of claim 7, further comprising a single bank of parallel switches for all banks of capacitors, for selectively connecting the capacitors.

13. The switched mode power supply of claim 7, further comprising a damping resistor in series with each capacitor.

14. The switched mode power supply of claim 7, wherein a resistance value of each switch is configured to dampen the supply output above a suppression frequency.

15. The switched mode power supply of claim 1, wherein the first switch is arranged to selectively connect the first inductor to the first voltage and the second voltage, and wherein the second switch is arranged to selectively connect the second inductor to the first voltage and the second voltage in order to generate a signal level at the supply output that corresponds to an input reference signal.

16. The switched mode power supply according to claim 15, further comprising an error amplifier for comparing the signal level at the supply output with the input reference signal and removing any error therebetween.

17. An envelope tracked power supply including a switched mode power supply according to claim 1.

18. An RF amplification stage including a switched mode power supply according to claim 1.

* * * * *